United States Patent
Terashima

(10) Patent No.: US 10,432,080 B2
(45) Date of Patent: Oct. 1, 2019

(54) DRIVING DEVICE OF SEMICONDUCTOR DEVICE

(71) Applicant: FUJI ELECTRIC CO., LTD., Kawasaki (JP)

(72) Inventor: Kenshi Terashima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/115,036

(22) Filed: Aug. 28, 2018

(65) Prior Publication Data

US 2018/0367023 A1 Dec. 20, 2018

Related U.S. Application Data

(63) Continuation of application No. PCT/JP2017/026556, filed on Jul. 21, 2017.

(30) Foreign Application Priority Data

Sep. 2, 2016 (JP) ................. 2016-172254

(51) Int. Cl.
*H02M 1/08* (2006.01)
*H02M 7/48* (2007.01)
(Continued)

(52) U.S. Cl.
CPC ............... *H02M 1/08* (2013.01); *H02M 1/32* (2013.01); *H02M 7/48* (2013.01);
(Continued)

(58) Field of Classification Search
None
See application file for complete search history.

(56) References Cited

U.S. PATENT DOCUMENTS 6,459,380 B1 * 10/2002 Watanabe ............... H02M 1/32
340/635
8,564,913 B2 * 10/2013 Motohashi ............. H02H 7/122
361/18
(Continued)

FOREIGN PATENT DOCUMENTS

JP 2003-347909 A 12/2003
JP 2012-143125 A 7/2012
(Continued)

OTHER PUBLICATIONS

International Search Report dated Oct. 10, 2017 in corresponding International Patent Application No. PCT/JP2017/026556.

*Primary Examiner* — Jeffery S Zweizig

(57) ABSTRACT

A driving device of a semiconductor device includes a plurality of protection factor detection units, an identification signal generation unit, a continuation signal generation unit, a signal selection unit, and an alarm signal output unit. The protection factor detection units detect an occurrence of a protection factor. The protection factor requires a protection operation of a semiconductor device. The protection factor detection units output a protection factor generation signal. When any protection factor detection units output the protection factor generation signal, the identification signal generation unit generates a protection factor identification signal. The continuation signal generation unit generates a protection factor continuation signal while the protection factor detection unit outputs the protection factor generation signal. The signal selection unit selects the protection factor identification signal and the protection factor continuation signal. The alarm signal output unit outputs a selection signal selected by the signal selection unit as an alarm signal.

12 Claims, 5 Drawing Sheets

(51) Int. Cl.
*H02M 1/32* (2007.01)
*H03K 17/082* (2006.01)
*H03K 17/18* (2006.01)
H02M 1/00 (2006.01)
H03K 17/08 (2006.01)
H02M 7/5387 (2007.01)

(52) U.S. Cl.
CPC ......... *H03K 17/0822* (2013.01); *H03K 17/18* (2013.01); *H02M 7/5387* (2013.01); *H02M 2001/0009* (2013.01); *H02M 2001/327* (2013.01); *H03K 2017/0806* (2013.01)

(56) References Cited

U.S. PATENT DOCUMENTS

| | | |
|---|---|---|
| 8,779,929 B2 | 7/2014 | Komatsu et al. |
| 9,337,719 B2 * | 5/2016 | Nakamori ............... H02M 7/48 |
| 9,667,061 B2 | 5/2017 | Sekigawa |
| 2012/0146782 A1 | 6/2012 | Komatsu et al. |
| 2015/0180227 A1 | 6/2015 | Sekigawa |

FOREIGN PATENT DOCUMENTS

| | | |
|---|---|---|
| JP | 2013-258858 A | 12/2013 |
| JP | 2014-103820 A | 6/2014 |

* cited by examiner

DRIVING DEVICE OF SEMICONDUCTOR DEVICE

CROSS-REFERENCE TO RELATED APPLICATIONS

This application is a continuation application, under 35 U.S.C. § 111(a), of International Application No. PCT/JP2017/026556, filed Jul. 21, 2017 which claims the priority benefit to Japanese Patent Application No. 2016-172254, filed Sep. 2, 2016, the entire contents of which is incorporated herein by reference.

TECHNICAL FIELD

The present invention relates to a driving device of semiconductor device that, for example, drives semiconductor devices constituting a power converter and has a notification function of a protected operation state.

BACKGROUND ART

Recently, an Intelligent Power Module (IPM) has attracted the attention. This Intelligent Power Module is produced by modularizing a protection circuit against abnormality such as an overcurrent of a semiconductor device, a short-circuit, a voltage drop of a control power supply, and overheating of a chip temperature as one electronic component together with the semiconductor devices (power transistors such as IGBTs and MOSFETs) and their driving circuits.

There has also been advocated that an alarm signal output circuit, which outputs a pulse signal configured to form an alarm signal with a predetermined pulse width according to a kind of abnormality detected at each protection circuit, and a notification signal output circuit, which outputs one pulse equivalent to the set pulse width as a protected operation notification signal when the pulse signal is output from this alarm signal output circuit, are incorporated into an Intelligent Power Module in addition to a plurality of protection circuits each detecting such abnormalities (for example, see PTL 1).

Providing such discrimination circuit outputting the alarm signal allows discriminating a kind of abnormality occurred in a semiconductor device by detecting the pulse width of the alarm signal on a control device side controlling a driving device, for example, an inverter control device.

However, there is a problem that only outputting the protected operation notification signal by one pulse as described above cannot detect that abnormality has been solved even when the abnormality of the semiconductor device has been solved. Therefore, to avoid the above-described defect beforehand, this applicant has advocated a driving device of semiconductor device that outputs an alarm signal with a predetermined width with which an abnormal cause is identifiable when the abnormal cause occurs at preset time intervals and outputs an alarm release signal with a pulse with different from that of the alarm signal width when the abnormal cause is solved and the output of the alarm signal is terminated to facilitate discrimination of the alarm signal and the detection of the solution of the abnormality (see PTL 2).

CITATION LIST

Patent Literature

PTL 1: JP 2012-143125 A
PTL 2: JP 2013-258858 A

SUMMARY OF INVENTION

Technical Problem

However, the driving device of semiconductor device advocated in PTL 2 requires a large-scale circuit to some extent to measure a purse width, discriminate a kind of abnormality, and determine whether an individual pulse is any of the alarm signal and the alarm release signal for detection of the termination of the output of the alarm signal, and this affects the cost.

Even in the case where the alarm release signal is not identified but whether the pulse signal is continuously output or not is detected and the alarm is determined to be released when the output of the pulse signal stops, a circuit that detects whether the pulse signal is continuously output or not needs to be a large-scale circuit to some extent. For example, from when the one alarm signal is detected until the next alarm signal is detected, the alarm signal is absent. In view of this, to determine the continuation between the alarm signals, the detection of the alarm signal needs to be stored, and deletion of this storage by the alarm release signal is required. When only whether the alarm has been released or not is desired to be known, a detection using a signal having two values that become an L level or a H level according to the presence/absence of the abnormal state is easy.

Considering a configuration of the driving device by a semiconductor integrated circuit (IC), there is a case where only a kind of abnormality needs to be discriminated and a case where only the presence/absence of the abnormal state needs to be discriminated depending on an application. Then, the semiconductor integrated circuits need to be developed individually to handle the respective cases individually.

The present invention has been made focusing on the above-described unsolved problems of the conventional examples, and an object of the present invention is to provide a driving device of semiconductor device configured to selectably output a signal identifying an abnormal cause and a signal representing continuation of the abnormal cause from an alarm terminal of the driving device.

Solution to Problem

In order to achieve the object, one aspect of a driving device of semiconductor device according to the present invention includes a plurality of protection factor detection units, an identification signal generation unit, a continuation signal generation unit, a signal selection unit, and an alarm signal output unit. The plurality of protection factor detection units are configured to detect an occurrence of a protection factor. The protection factor requires a protection operation of a semiconductor device constituting a power converter. The plurality of protection factor detection units are configured to output a protection factor generation signal. The identification signal generation unit is configured such that when any of the plurality of protection factor detection units outputs the protection factor generation signal, the identification signal generation unit generates a protection factor identification signal. The protection factor identification signals have pulse widths different depending on the plurality of protection factor detection units. The continuation signal generation unit is configured to generate a protection factor continuation signal while the protection factor detection unit outputs the protection factor generation signal. The signal selection unit is configured to select any one of the protection factor identification signal and the protection factor continuation signal. The alarm signal output unit is configured to output a selection signal selected by the signal selection unit as an alarm signal.

Advantageous Effects of Invention

According to one aspect of the present invention, a signal selection unit can select whether any of a protection factor generation signal with which a kind of a protection factor generated by an identification signal generation unit is identifiable and a protection factor continuation signal that represents continuation of the protection factor generated by a continuation signal generation unit is output. In view of this, as necessary, a driving device can output only any one of the protection factor generation signal and the protection factor continuation signal and also can output the protection factor generation signal and then output the protection factor continuation signal. An alarm signal corresponding to a system environment monitoring the alarm signal can be output.

DESCRIPTION OF EMBODIMENTS

Figure 1:
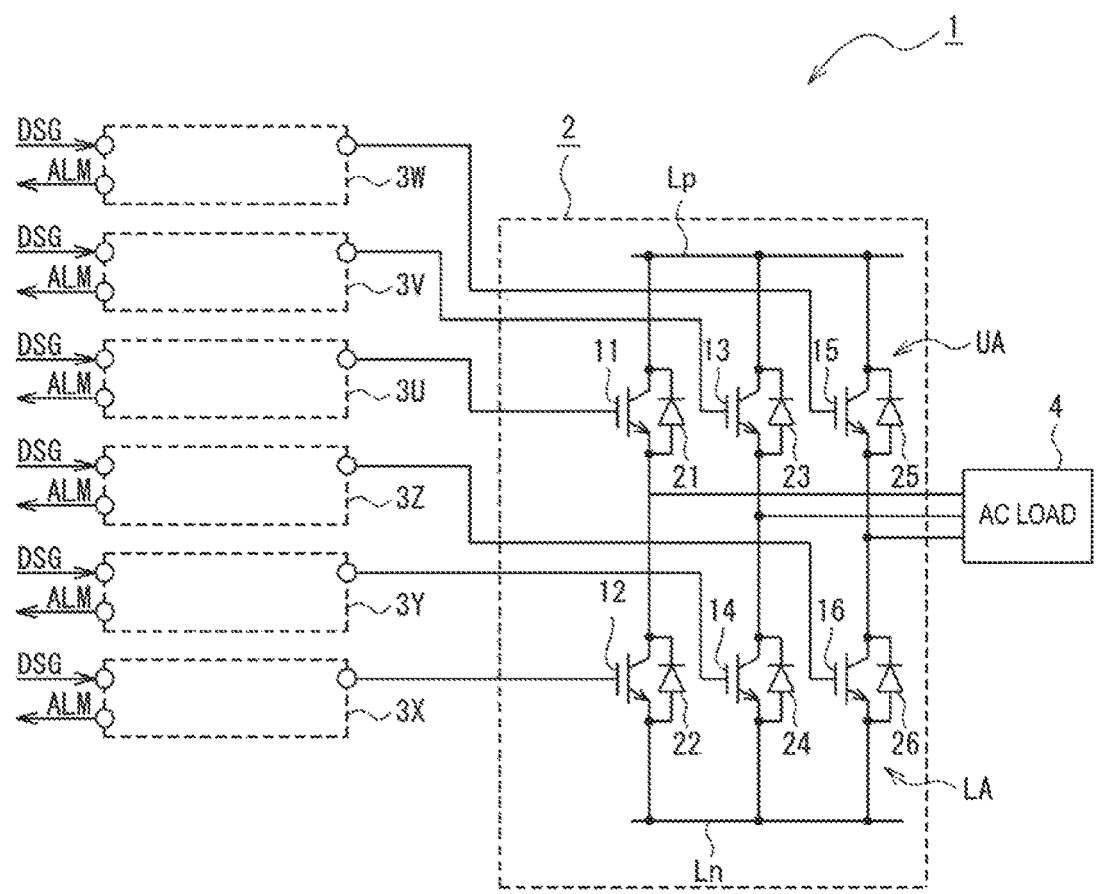
FIG. 1 is a block diagram illustrating an overall schematic configuration of a power converter to which the present invention is applied.

One embodiment of the present invention will now be described with reference to the drawings. In the following description of the drawings, the identical or similar reference numerals are assigned to the identical or similar parts.

Further, the following embodiments are exemplary devices and methods that embody the technical idea of the present invention, and do not identify the technical idea of the present invention to the materials, shapes, configurations, arrangements, and the like of components described below. Various modifications can be added to the technical idea of the present invention within the technical scope specified by claims described in CLAIMS.

Embodiments of the present invention will be described below by referring to the accompanying drawings.

As illustrated in FIG. 1, a power converter 1 includes an inverter 2, which converts a DC power into an AC power, and driver circuits 3U to 3Z of respective phases as a driving device of semiconductor device that individually drives semiconductor devices of the respective phases (a U-phase to a Z-phase) constituting this inverter 2.

The inverter 2 includes Insulated Gate Bipolar Transistors (IGBTs) 11 to 16 as six pieces of the semiconductor devices. In these IGBTs 11 to 16, series circuits of the IGBTs 11 and 12, series circuits of the IGBTs 13 and 14, and series circuits of the IGBTs 15 and 16 are each coupled in parallel between a positive-electrode side line Lp and a negative-electrode side line Ln coupled to a DC power supply and to which a DC power is supplied. Here, freewheeling diodes 21 to 26 are coupled to the respective IGBTs 11 to 16 in an antiparallel manner.

The IGBTs 11, 13, and 15 are configured as the U-phase, a V-phase, and a W-phase, respectively, thus constituting an upper arm UA. The IGBTs 12, 14, and 16 are configured as an X-phase, a Y-phase, and the Z-phase, respectively, thus constituting a lower arm LA. Furthermore, a three-phase AC power is output from a coupling point of the IGBTs 11 and 12, a coupling point of the IGBTs 13 and 14, and a coupling point of the IGBTs 15 and 16. This three-phase AC power is supplied to an AC load 4 such as an electric motor.

Figure 2:
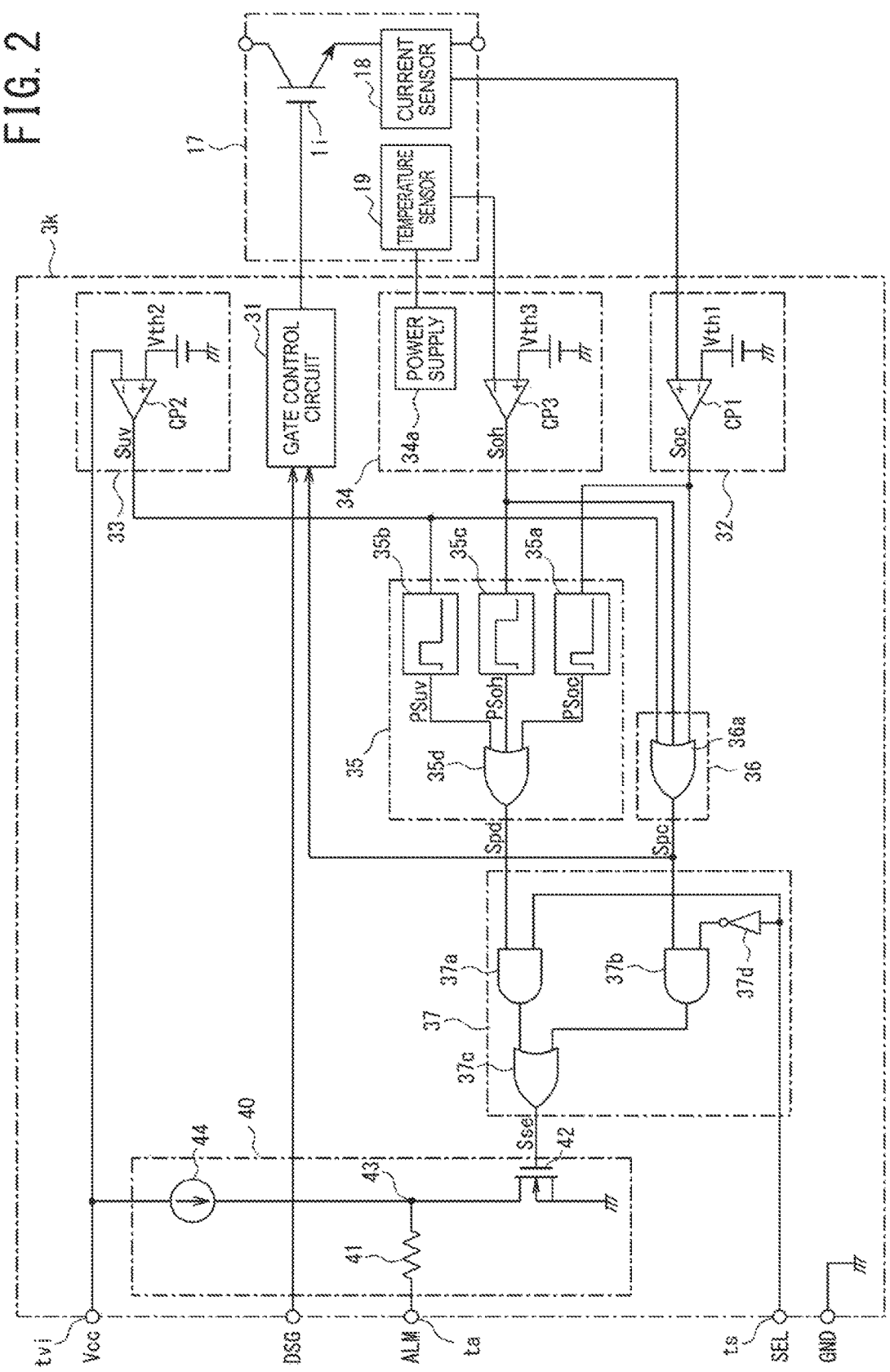
FIG. 2 is a block diagram illustrating a specific configuration of a driver circuit.

As illustrated in FIG. 2, the IGBTs 11 to 16 are disposed in a chip (a semiconductor chip) 17. This chip 17 internally includes a current sensor 18 and a temperature sensor 19. The current sensor 18 is constituted of a current sensing IGBT (not illustrated) that detects a current flowing between a collector and an emitter of an IGBT 1$i$ (i=1 to 6) and a current sensing resistor (not illustrated). The temperature sensor 19 is constituted of a temperature detection diode that detects a temperature inside the chip.

As illustrated in FIG. 2, a driver circuit 3$k$ (k=U to Z) of each phase includes a gate control circuit 31, an overcurrent detection circuit 32 as a protection factor detection unit, a control voltage detection circuit 33, and a chip temperature detection circuit 34. The gate control circuit 31 performs an ON/OFF control on a gate of each IGBT 1$i$ constituting the inverter 2. The overcurrent detection circuit 32 detects an overcurrent state of the IGBT 1$i$, which is information necessary for a protection operation of the IGBT 1$i$. The control voltage detection circuit 33 detects a low-voltage state of a control voltage, which is information necessary for the protection operation of the IGBT 1$i$. The chip temperature detection circuit 34 detects an overheating state of the chip 17, which is information necessary for the protection operation of the IGBT 1$i$.

The driver circuits 3U to 3Z of the phases each include an identification signal generation unit 35, a continuation signal generation unit 36, a signal selection unit 37, and an alarm signal output unit 40.

To the gate control circuit 31, a pulse-width modulation (PWM) signal is input from the outside of the driver circuits 3U to 3Z as an operation signal DSG and a protection factor continuation signal Spc output from the continuation signal generation unit 36 is input. While the protection factor continuation signal Spc is a low level, this gate control circuit 31 outputs the operation signal DSG to the gate of the IGBT 1$i$. While the protection factor continuation signal Sps is a high level, the gate control circuit 31 stops outputting the operation signal DSG to the gate of the IGBT 1$i$.

The overcurrent detection circuit 32 includes a comparator CP1 to which a detected current value (a voltage signal) detected by the current sensor 18 is input and an overcurrent threshold Vth1 is input. When the detected current value exceeds the overcurrent threshold Vth1, this comparator CP1 outputs a high-level overcurrent detection signal Soc representing the overcurrent state becoming the protection factor to the identification signal generation unit 35 and the continuation signal generation unit 36 as a protection factor generation signal. Accordingly, the overcurrent detection circuit 32 can detect the overcurrent of the IGBT 1i.

The control voltage detection circuit 33 includes a comparator CP2 to which a control voltage Vcc (for example, 15 [V]) is input from the outside of the driver circuits 3U to 3Z and a low-voltage threshold Vth2 is input. When the control voltage Vcc falls below the low-voltage threshold Vth2, this comparator CP2 outputs a high-level low-voltage detection signal Suv representing a shortage of the control voltage becoming the protection factor to the identification signal generation unit 35 and the continuation signal generation unit 36 as the protection factor generation signal. Accordingly, the control voltage detection circuit 33 can detect the shortage of the control voltage, that is, a voltage drop of an IC power supply.

The chip temperature detection circuit 34 includes a comparator CP3 to which a detected temperature value (a voltage signal) detected by the temperature sensor 19 is input and an overheating threshold Vth3 is input. When the detected temperature value falls below the overheating threshold Vth3, this comparator CP3 outputs a high-level overheat detection signal Soh representing the overheating state becoming the protection factor to the identification signal generation unit 35 and the continuation signal generation unit 36 as the protection factor generation signal. Accordingly, the chip temperature detection circuit 34 can detect the overheating state of the chip 17 incorporating the IGBT 1i.

A power supply 34a in the chip temperature detection circuit 34 illustrated in FIG. 2 is to supply a diode with a constant current when the temperature sensor 19 is constituted of the temperature detection diode.

The identification signal generation unit 35 includes a first one-shot circuit 35a, a second one-shot circuit 35b, and a third one-shot circuit 35c constituted of one-shot circuits, and an OR gate 35d to which output pulses are input from these circuits.

Figure 3:
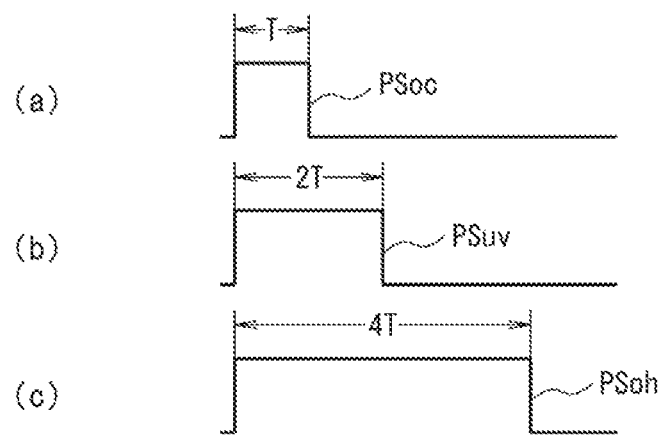
FIG. 3 is a signal waveform diagram illustrating a protection factor identification signal output from an identification signal generation unit.

As illustrated in (a) of FIG. 3, when the overcurrent detection signal Soc, which detects the overcurrent state of the IGBT 1i, is input from the overcurrent detection circuit 32, the first one-shot circuit 35a changes a state of a pulse signal PSoc from the low level in the usual state to the high level and outputs this pulse signal PSoc where the high-level pulse width becomes, for example, a basic pulse width T to the OR gate 35d. For example, 2 [ms] can be employed as the basic pulse width T.

As illustrated in (b) of FIG. 3, when the high-level low-voltage detection signal Suv, which detects the shortage of the control voltage, that is, the low voltage of the IC power supply, is input from the control voltage detection circuit 33, the second one-shot circuit 35b changes the state of the pulse signal PSuv from the low level in the usual state to the high level and outputs this pulse signal PSuv where the high-level pulse width becomes, for example, 2T (=4 ms) to the OR gate 35d.

Furthermore, as illustrated in (c) of FIG. 3, when the overheat detection signal Soh, which detects the overheating state of the IGBT 1i, is input from the chip temperature detection circuit 34, the third one-shot circuit 35c changes a state of a one-shot pulse signal PSoh from the low level in the usual state to the high level and outputs this one-shot pulse signal PSoh where the high-level pulse width becomes, for example, 4T (=8 ms) to the OR gate 35d.

When any one of the one-shot pulse signals PSoc, PSuv, and PSoh output from the first one-shot circuit 35a, the second one-shot circuit 35b, and the third one-shot circuit 35c is the high level, the OR gate 35d outputs a protection factor identification signal Spd becoming the high level to the signal selection unit 37.

Here, since the pulse width of the protection factor identification signal Spd is sufficiently short, 2 to 8 [ms], for example, after the overcurrent state occurs, even when the overheating state caused by the overcurrent state occurs and two or more pulse signals PSj (j=oc, uv, oh) occur, the two or more pulse signals PSj are hardly input simultaneously.

This, the identification signal generation unit 35 outputs the protection factor identification signal Spd as the pulse signal corresponding to the detection circuits 32 to 34 that have detected the overcurrent, the shortage of control voltage, or the overheating state, that is, the detection circuits 32 to 34 that have detected the protection factor requiring the protection operation among the overcurrent detection circuit 32, the control voltage detection circuit 33, and the chip temperature detection circuit 34 to the signal selection unit 37.

The continuation signal generation unit 36 includes an OR gate 36a. To the OR gate 36a, the overcurrent detection signal Soc output from the overcurrent detection circuit 32, the low-voltage detection signal Suv output from the control voltage detection circuit 33, and the overheat detection signal Soh output from the chip temperature detection circuit 34 are input. When any one of the input signals of the overcurrent detection signal Soc, the low-voltage detection signal Suv, and the overheat detection signal Soh changes the state from the low level in the usual state to the high level, this OR gate 36a changes the state of the protection factor continuation signal Spc, which changes the state to the usual state when all input signals recover to the usual state, from the low level in the usual state to the high level and outputs the protection factor continuation signal Spc to the gate control circuit 31 and the signal selection unit 37.

The signal selection unit 37 includes a first AND gate 37a, a second AND gate 37b, and an OR gate 37c. The protection factor identification signal Spd output from the identification signal generation unit 35 is input to one input terminal of the first AND gate 37a, and a signal for selection SEL input from an external control device to a selection signal input terminal ts is input to the other input terminal. Accordingly, a logical conjunction signal generated by performing a logical conjunction of the protection factor identification signal Spd and the signal for selection SEL is output from the first AND gate 37a.

The protection factor continuation signal Spc output from the continuation signal generation unit 36 is input to one input terminal of the second AND gate 37b. The signal for selection SEL input to the selection signal input terminal ts logically inverted by a logical inversion circuit (a NOT circuit) 37d is input to the other input terminal. Accordingly, a logical conjunction signal generated by performing a logical conjunction of the protection factor continuation signal Spc and the signal generated by the logical inversion of the signal for selection SEL is output from the second AND gate 37b.

The logical conjunction signal of the first AND gate 37a and the logical conjunction signal of the second AND gate 37b are input to the OR gate 37c. An internal selection signal Sse that becomes a high level when any one of both logical conjunction signals becomes the high level is output to the alarm signal output unit 40.

The alarm signal output unit 40 has a series circuit of a resistor 41 (a limiting resistor) coupled in series between an alarm signal output terminal ta and the ground and an N-channel MOSFET 42 as a semiconductor switch element. Here, a drain (a high-potential side terminal) of the MOSFET 42 is coupled to the alarm signal output terminal ta via the resistor 41, the source (the low-potential side terminal) is coupled to the ground, and the gate (the control terminal) is coupled to an output terminal of the OR gate 37c of the signal selection unit 37.

The other end of a constant current circuit 44 whose one end is coupled to a control power supply input terminal tvi serving as a DC power supply terminal is coupled to a coupling point 43 of the resistor 41 with the MOSFET 42. This constant current circuit 44, for example, supplies a constant current at 200 [μA] to the coupling point 43.

In view of this, while the MOSFET 42 is in an off state, the coupling point 43 becomes the control voltage Vcc, becoming the control voltage Vcc at which the alarm signal output terminal ta becomes the high level. Meanwhile, while the MOSFET 42 is in an on state, since the constant current from the constant current circuit 44 flows to the ground, the coupling point 43 becomes a ground potential becoming the low level and the alarm signal output terminal ta also becomes the ground potential.

Accordingly, an alarm signal ALM having the two levels, the high level and the low level, is output from the alarm signal output terminal ta.

Next, the following describes operations of the power converter 1 of this embodiment.

First, assume that, at a time point t0, the detected value of the current flowing through the IGBTs 11 to 16 constituting the inverter 2 is less than the overcurrent threshold Vth1, which is normal, the detected value of the temperature inside the chip 17 in which the IGBTs 11 to 16 are formed is equal to or more than the overheating threshold Vth3, which is normal, and further the control voltage Vcc (the IC power supply voltage) supplied to each of the driver circuits 3U to 3Z exceeds the low-voltage threshold Vth2, which is normal.

Figure 4:
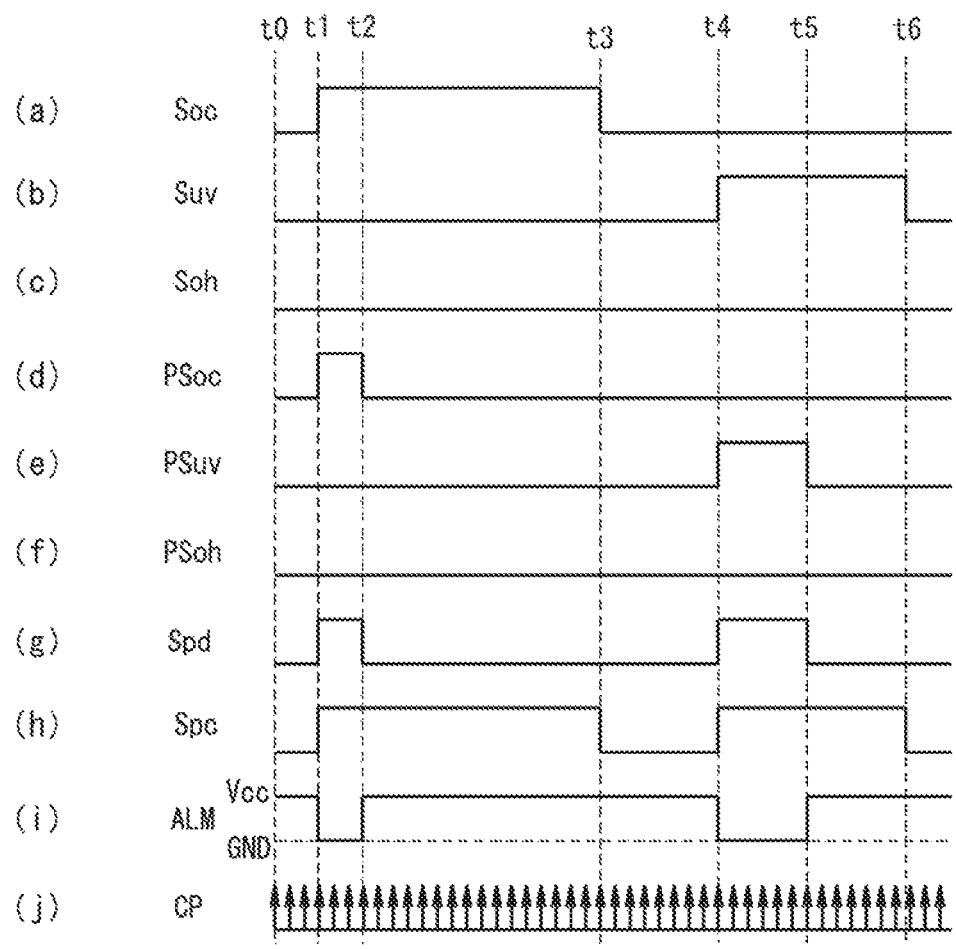
FIG. 4 is a signal waveform diagram presented for description of an operation of this embodiment.

As illustrated in (a) to (c) of FIG. 4, at the time point t0, all of the overcurrent detection signal Soc output from the overcurrent detection circuit 32, the low-voltage detection signal Suv output from the control voltage detection circuit 33 of each of the driver circuits 3U to 3Z, and the overheat detection signal Soh output from the chip temperature detection circuit 34 become the low level in this normal state.

Therefore, as illustrated in (d) to (f) of FIG. 4, the outputs from the first one-shot circuit 35a, the second one-shot circuit 35b, and the third one-shot circuit 35c in the identification signal generation unit 35 maintain the low level. Accordingly, as illustrated in (g) of FIG. 4, the protection factor identification signal Spd output from the OR gate 35d maintains the low level and the protection factor continuation signal Spc also maintains the low level as illustrated in (h) of FIG. 4.

At this time, assume that the signal for selection SEL input to the selection signal input terminal is the high level and the identification signal generation unit 35 is selected. In this state, since the protection factor identification signal Spd output from the identification signal generation unit 35 maintains the low level, the logical conjunction output from the first AND gate 37a becomes the low level. In view of this, the internal selection signal Sse output from the OR gate 37c becomes the low level, and the MOSFET 42 in the alarm signal output unit 40 maintains the off state. Accordingly, the electric potential of the coupling point 43 becomes the high level, the electric potential of the control voltage Vcc, and the alarm signal ALM output from the alarm signal output terminal to becomes the electric potential of the control voltage Vcc representing the normal state as illustrated in (i) of FIG. 4.

In view of this, since the protection factor continuation signal Spc is the low level, in the respective driver circuits 3X to 3Z, the gate control circuit 31 supplies a gate signal according to the operation signal DSG input from the external control device (not illustrated) to the gates of the IGBTs 11 to 16, the inverter 2 converts the DC power into the AC power, and the AC power is output to the AC load 4.

Afterwards, assume that, at a time point t1, for example, the overcurrent detection circuit 32 in the certain driver circuit 3k detects that a detected value of a collector current of the IGBT 1i constituting the inverter 2 becomes equal to or more than the overcurrent threshold Vth1 from the state where the IGBTs 11 to 16 of the respective phases in this inverter 2 are in the normal state and the IC power supply voltage is normal.

In this case, as illustrated in (a) of FIG. 4, the overcurrent detection circuit 32 outputs the high-level overcurrent detection signal Soc at the time point t1. This overcurrent detection signal Soc is supplied to the identification signal generation unit 35 and the continuation signal generation unit 36.

In the identification signal generation unit 35, the high-level overcurrent detection signal Soc is supplied to the first one-shot circuit 35a; therefore, this first one-shot circuit 35a outputs the high-level pulse signal PSoc with the pulse width T illustrated in (d) of FIG. 4.

Accordingly, the OR gate 35d in the identification signal generation unit 35 outputs the high-level protection factor identification signal Spd illustrated in (g) of FIG. 4, and this protection factor identification signal Spd is input to the first AND gate 37a in the signal selection unit 37.

Meanwhile, in the continuation signal generation unit 36, the high-level overcurrent detection signal Soc is input from the overcurrent detection circuit 32 to the OR gate 36a; therefore, this protection factor continuation signal Spc output from the OR gate 36a becomes the high level. This high-level protection factor continuation signal Spc is supplied to the gate control circuit 31 and the second AND gate 37b of the signal selection unit 37.

At this time, since the high-level signal for selection SEL inverted to the low level by the logical inversion circuit 37d is input to the second AND gate 37b of the signal selection unit 37, the logical conjunction output of the second AND gate 37b maintains the low level regardless of the state of the protection factor continuation signal Spc output from the continuation signal generation unit 36.

In view of this, the internal selection signal Sse output from the OR gate 37c of the signal selection unit 37 becomes the high level, and this high-level internal selection signal Sse is supplied to the gate of the MOSFET 42 in the alarm signal output unit 40. In view of this, the MOSFET 42 becomes a turn-on state and as illustrated in (i) of FIG. 4, the alarm signal ALM becoming the low level is output from the alarm signal output terminal to to the external control device.

Simultaneous with this, the high-level protection factor continuation signal Spc output from the continuation signal generation unit 36 is supplied to the gate control circuit 31, and the gate control circuit 31 stops outputting a gate driving signal. This turns off the IGBT 11 and the state enters a protected state.

Afterwards, at a time point t2 at which a period by the pulse width T passes from the time point t1, the pulse signal PSoc output from the first one-shot circuit 35a in the identification signal generation unit 35 recovers from the high level to the low level as illustrated in (d) of FIG. 4. In response to this, the MOSFET 42 in the alarm signal output unit 40 becomes a turn-off state. In view of this, the electric potential of the coupling point 43 increases up to the control voltage Vcc, and the alarm signal output from the alarm signal output terminal to recovers from the low level to the high level as illustrated in (i) of FIG. 4.

Meanwhile, when the alarm signal ALM is input from the driver circuit 3k, the external control device counts a clock signal CP illustrated in (j) of FIG. 4 while this alarm signal ALM maintains the low level, which is a ground potential GND. This count is multiplied by a period between the pulses of the clock signal CP to calculate an integrated time, thereby ensuring detection that the alarm signal ALM is generated by the overcurrent detection signal Soc from this integrated time. This ensures easy determination that the protection factor occurred in the IGBT 1i is an overcurrent protection factor. Note that the kind of the protection factor detection circuit may be discriminated by the count of the clock signal CP in a period during which the alarm signal ALM maintains the low level, the ground potential GND.

Afterwards, at a time point t3, when the overcurrent detection circuit 32 detects that the detected value of the collector current of the IGBT 1i constituting the inverter 2 becomes less than the overcurrent threshold Vth1, the overcurrent detection signal Soc output from the overcurrent detection circuit 32 recovers from the high level to the low level as illustrated in (a) of FIG. 4. In response to this, the protection factor continuation signal Spc output from the continuation signal generation unit 36 also recovers from the high level to the low level as illustrated in (h) of FIG. 4. In view of this, the gate control circuit 31 outputs the gate driving signal according to the operation signal DSG to the gate of the IGBT 1i, and the IGBT 1i recovers to the normal operation state.

The protection factor identification signal Spd output from the OR gate 35d of the identification signal generation unit 35 does not change in the signal selection unit 37; therefore, the internal selection signal Sse maintains the low level, the MOSFET 42 in the alarm signal output unit 40 maintains the off state, and the alarm signal ALM output from the alarm signal output terminal to maintains the high level.

Similarly, at a time point t4, when a low-voltage abnormality where the control voltage Vcc as the IC power supply voltage supplied to the certain driver circuit 3k lowers to the low-voltage threshold Vth2 or less occurs, the control voltage detection circuit 33 detects this low-voltage abnormality.

Then, the control voltage detection circuit 33 supplies the high-level low-voltage detection signal Suv to the identification signal generation unit 35 and the continuation signal generation unit 36. In view of this, the second one-shot circuit 35b in the identification signal generation unit 35 outputs the high-level pulse signal PSuv with the pulse width 2T at a time point t4 as illustrated in (e) of FIG. 4. Simultaneously, the protection factor continuation signal Spc output from the continuation signal generation unit 36 is inverted from the low level to the high level as illustrated in (h) of FIG. 4.

In view of this, the high-level protection factor continuation signal Spc is supplied to the gate control circuit 31, the gate control circuit 31 stops outputting the gate driving signal. This turns off the IGBT 11 and the state enters the protected state.

At this time, since the protection factor identification signal Spd output from the identification signal generation unit 35 becomes the high level as illustrated in (g) of FIG. 4, a logical conjunction output signal from the first AND gate 37a of the signal selection unit 37 becomes the high level. In view of this, the internal selection signal Sse output from the OR gate 37c becomes the high level, and the MOSFET 42 in the alarm signal output unit 40 becomes the turn-on state. Therefore, the coupling point 43 is coupled to the ground through the MOSFET 42, and the electric potential at the coupling point becomes the low level, the ground potential GND. Therefore, as illustrated in (i) of FIG. 4, the electric potential of the alarm signal ALM changes the state from the high level of a control voltage Vcc to the low level of the ground potential GND representing occurrence of abnormality and the state entering the protected state.

Afterwards, at a time point t5 at which a period by the pulse width 2T passes from the time point t4, the protection factor identification signal PSuv output from the second one-shot circuit 35b in the identification signal generation unit 35 recovers from the high level to the low level as illustrated in (e) of FIG. 4. In response to, the MOSFET 42 in the alarm signal output unit 40 enters the turn-off state. In view of this, the electric potential of the coupling point 43 recovers to the control voltage Vcc. Accordingly, the alarm signal ALM output from the alarm signal output terminal to recovers to the high level becoming the control voltage Vcc as illustrated in (i) of FIG. 4.

In view of this, since the pulse width of the low level becoming the ground potential GND of the alarm signal ALM is 2T in the external control device, it can be recognized that a control voltage drop protection factor where the control voltage Vcc is lower than the low-voltage threshold Vth2 occurs.

Afterwards, at a time point t6, when the control voltage Vcc supplied from the outside recovers to a normal voltage higher than the low-voltage threshold Vth2, the low-voltage detection signal Suv output from the control voltage detection circuit 33 recovers from the high level to the low level as illustrated in (b) of FIG. 4. At this time, since the output from the second one-shot circuit 35b in the identification signal generation unit 35 maintains the low level, the protection factor identification signal Spd output from the OR gate 35d maintains the low level. In view of this, the internal selection signal Sse output from the signal selection unit 37 also maintains the low level and the MOSFET 42 in the alarm signal output unit 40 maintains the off state. The alarm signal ALM output from the alarm signal output terminal to maintains the high level as illustrated in (i) of FIG. 4.

Meanwhile, as illustrated in (h) of FIG. 4, the protection factor continuation signal Spc output from the continuation signal generation unit 36 recovers from the high level to the low level. In view of this, the gate driving signal according to the operation signal DSG is output from the gate control circuit 31 to the gate of the IGBT 1i, thus recovering the IGBT 1i to the normal operation state.

Similarly, when the chip temperature detection circuit 34 in the certain driver circuit 3k detects that the detected value of the temperature inside the chip 17 incorporating the IGBT 1$i$ constituting the inverter 2 becomes less than the overheating threshold Vth3, the high-level overheat detection signal Soh is output from the chip temperature detection circuit 34. This overheat detection signal Soh is supplied to the identification signal generation unit 35. In view of this, the third one-shot circuit 35$c$ in the identification signal generation unit 35 outputs the high-level one-shot pulse signal PSoh with the pulse width 4T. Accordingly, the protection factor identification signal Spd output from the identification signal generation unit 35 becomes the signal corresponding to the one-shot pulse signal PSoh, the MOSFET 42 in the alarm signal output unit 40 enters the turn-on state, and the low-level alarm signal ALM corresponding to the pulse width 4T of the one-shot pulse signal PSoh is output to the external control device.

In view of this, since the pulse width of the low level of the alarm signal ALM is 4T, the external control device can recognize the overheating abnormality in the chip 17.

Thus, when the signal for selection SEL output from the external control device is the high level, the signal selection unit 37 selects the protection factor identification signal Spd output from the identification signal generation unit 35. In view of this, as illustrated in FIG. 5, the alarm signal ALM output from the alarm signal output unit 40 becomes the pulse width according to the one-shot pulse signals PSoc, PSuv, and PSoh whose pulse widths generated by the identification signal generation unit 35 according to various protection factors, the overcurrent protection factor, the control voltage drop protection factor, and the overheating protection factor, are different, which are T, 2T, and 4T.

This alarm signal ALM represents the kind of the protection factor and becomes the pulse signal corresponding to the pulse width according to the protection factor at the time point when the various protection factors occur, regardless of the period during which the protection factor occurs. That is, when the period during which the protection factor occurs is equal to or less than a period tALM of the alarm signal ALM, the IGBT 1$i$ enters the protected state by the protection factor continuation signal Spc output from the continuation signal generation unit 36. However, the alarm signal ALM formed by the protection factor identification signal Spd generated by the identification signal generation unit 35 becomes longer than the period during which the protection factor occurs.

Figure 5:
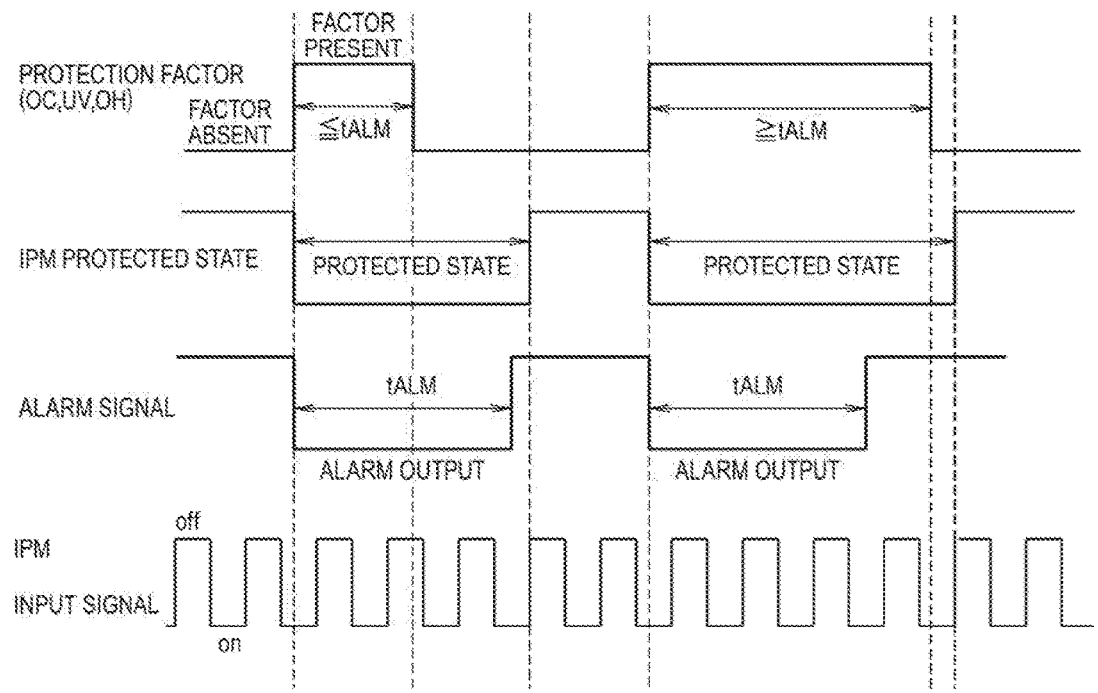
FIG. 5 is a signal waveform diagram illustrating a relationship between a protection factor when a signal for selection SEL input from an external control device is set to a high level and an alarm signal by a protection factor identification signal from the identification signal generation unit.

Conversely, when the period during which the protection factor occurs is longer than the period tALM of the alarm signal ALM, as illustrated in the right half part of FIG. 5, the period of the alarm signal ALM becomes shorter than the period during which the protection factor occurs.

Accordingly, the period during which the protection factor occurs cannot be discriminated only by the protection factor identification signal Spd.

In contrast to this, setting the signal for selection SEL output from the external control device to the low level allows the discrimination during which the protection factor occurs. Setting the signal for selection SEL to the low level always maintains the logical conjunction output signal from the first AND gate 37$a$ of the signal selection unit 37 to the low level. Instead of this, the logical conjunction output signal from the second AND gate 37$b$ alternately repeats the high level and the low level according to the protection factor continuation signal Spc output from the continuation signal generation unit 36.

Figure 6:
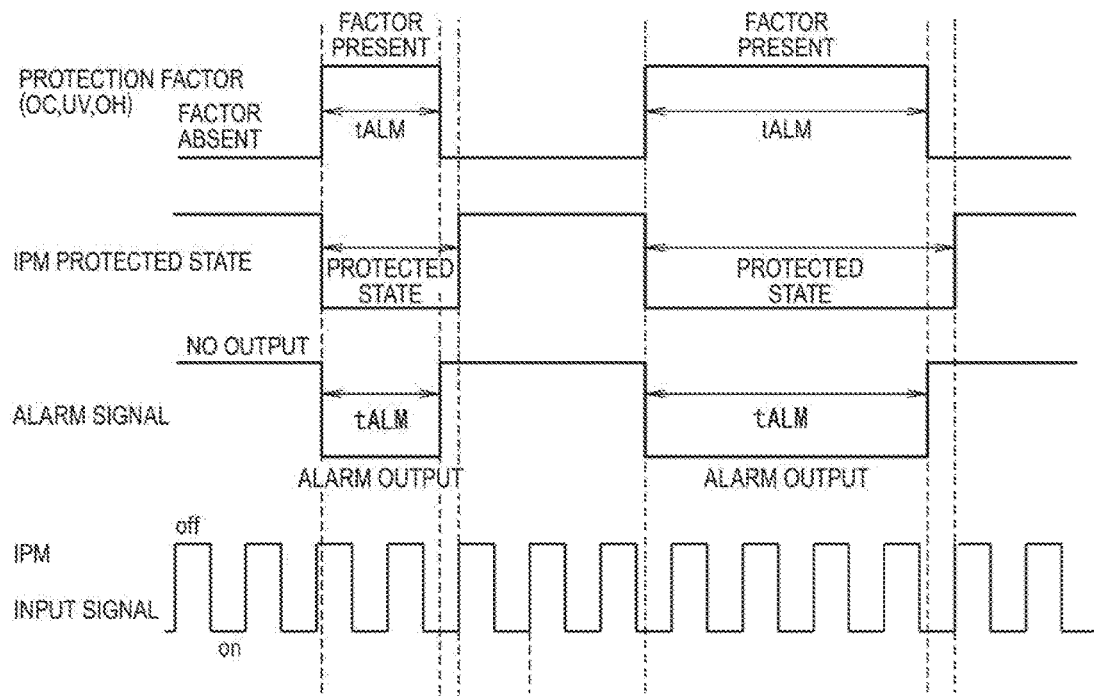
FIG. 6 is a signal waveform diagram illustrating a relationship between the protection factor when the signal for selection SEL input from the external control device is set to a low level and the alarm signal by the protection factor identification signal from the identification signal generation unit.

In view of this, the MOSFET 42 in the alarm signal output unit 40 is on-off controlled according to the protection factor continuation signal Spc. As described above, this protection factor continuation signal Spc maintains the high level while the detection signals detected by the overcurrent detection circuit 32, the control voltage detection circuit 33, and the chip temperature detection circuit 34 serving as protection factor detection units continue to be the high level. Accordingly, as illustrated in FIG. 6, the alarm signal ALM becomes the low level in a period identical to the period tALM during which the protection factor occurs. Consequently, the low level period of the alarm signal ALM becomes a period approximately equal to the protected period of the IGBT 1$i$. Accordingly, although the detection of the alarm signal ALM by the external control device fails to discriminate the kind of the generated protection factor, whether the protection factor occurs or not can be surely discriminated.

Moreover, since the external control device itself outputs the signal for selection SEL and inputs the signal for selection SEL to each driver circuit 3$k$. Therefore, by the external control device itself using the signal for selection SEL differently according to the purpose, whether the alarm signal ALM is based on the protection factor identification signal Spd or based on the protection factor continuation signal Spc can be surely recognized.

That is, when the external control device puts emphasis on the kind of the protection factor for the IGBT 1$i$, setting the signal for selection SEL to the high level ensures recognizing the kind of the protection factor from the pulse width of the alarm signal ALM when the protection factor occurs.

Conversely, when the external control device puts emphasis on whether the protection factor for the IGBT 1$i$ occurs or not, setting the signal for selection SEL to the low level ensures recognizing the occurrence of any of the protection factors when the alarm signal ALM is the low level. Moreover, only the determination of whether the alarm signal ALM is the low level or the high level allows easily discriminating whether the protection factor continues or not.

Further, the external control device usually, for example, sets the signal for selection SEL to the high level and monitors an alarm signal ALM based on the protection factor identification signal Spd to discriminate the kind of the generated protection factor. When the kind of the protection factor can be recognized, the signal for selection SEL is inverted to the low level, and the period during which the protection factor continues can be confirmed. In view of this, the signal for selection SEL is set to the high level and, for example, the overcurrent protection factor is recognized by the alarm signal ALM. After that, the signal for selection SEL is set to the low level, and the period during which the protection factor continues is confirmed. This allows the determination that the transient overcurrent flows through the IGBT 1$i$ when the period during which the protection factor continues is short and allows the determination that short-circuit occurs between the collector and the emitter of the IGBT 1$i$ and an overcurrent flows when the period during which the protection factor continues is long.

While one embodiment of the present invention has been described above, the present invention is not limited to these and various modifications and improvements are possible.

For example, in the case where the protection factors detected by the overcurrent detection circuit 32, the control voltage detection circuit 33, and the chip temperature detection circuit 34 are detected, as long as the pulse widths are different to be identifiable, any pulse width is settable, not limited to the case where the pulse widths generated in the one-shot circuits 35$a$, 35$b$, and 35$c$ are set as T, 2T, and 4T.

A low-level pulse width may be set, not limited to the case of setting the high-level pulse width of each of the detection circuits 32, 33, and 34.

While the above-described embodiment describes the case of disposing the overcurrent detection circuit 32, the control voltage detection circuit 33, and the chip temperature detection circuit 34 as the protection factor detection circuits, one or two of these circuits may be disposed.

Furthermore, while the above-described embodiment describes the case of the identification of the protection factor and the determination of the continuous state by the low level of the alarm signal ALM, the logic may be inverted, and the protection factor may be identified and the continuous state may be discriminated by the high level of the alarm signal ALM.

An input selection circuit that blocks an input of another protection factor detection signal for a predetermined period when the one protection factor detection signal is input to the identification signal generation unit 35 may be disposed.

Furthermore, while the case where the alarm signal output unit 40 includes the constant current circuit 44 has been described above, this should not be construed in a limiting sense. A pull-up resistor may be applied instead of the constant current circuit 44.

While the above-described embodiment describes the case where the external control device inputs the signal for selection SEL, this should not be construed in a limiting sense. That is, to fix the alarm signal ALM to the protection factor identification signal Spd or the protection factor continuation signal Spc according to a specification of a product, wirings coupled to the first AND gate 37a and the second AND gate 37b of the signal selection unit 37 in the driver circuit 3k and transmits the signal for selection SEL may be fixed to the high level or the low level.

REFERENCE SIGNS LIST 1 power converter
2 inverter
3U to 3Z driver circuit
4 AC load
11 to 16 IGBT
17 chip
18 current sensor
19 temperature sensor
21 to 26 freewheeling diode
UA upper arm
LA lower arm
31 gate control circuit
32 overcurrent detection circuit
33 control voltage detection circuit
34 chip temperature detection circuit
35 identification signal generation unit
35a first one-shot circuit
35b second one-shot circuit
35c third one-shot circuit
35d OR gate
36 continuation signal generation unit
36a OR gate
37 signal selection unit
37a first AND gate
37b second AND gate
37c OR gate
40 alarm signal output unit
41 resistor
42 MOSFET
43 coupling point
44 constant current circuit
Spd protection factor identification signal
Spc protection factor continuation signal
Sse internal selection signal
SEL signal for selection

The invention claimed is:

1. A driving device of a semiconductor device comprising:
a plurality of protection factor detection units configured to detect an occurrence of a protection factor, the protection factor requiring for a protection operation of the semiconductor device constituting a power converter, the plurality of protection factor detection units being configured to output a protection factor generation signal;
an identification signal generation unit configured such that when any of the plurality of protection factor detection units outputs the protection factor generation signal, the identification signal generation unit generates a protection factor identification signal, the protection factor identification signal having pulse widths different depending on the plurality of protection factor detection units;
a continuation signal generation unit configured to generate a protection factor continuation signal while any of the plurality of protection factor detection units outputs the protection factor generation signal;
a signal selection unit configured to select any one of the protection factor identification signal and the protection factor continuation signal; and
an alarm signal output unit configured to output a selection signal selected by the signal selection unit as an alarm signal.

2. The driving device of the semiconductor device according to claim 1, wherein
the identification signal generation unit includes:
a plurality of one-shot circuits configured to individually receive protection factor generation signals output from the plurality of protection factor detection units, the plurality of one-shot circuits being configured to generate pulses with pulse widths different depending on the protection factor detection units; and
an OR gate configured to receive output signals from the plurality of one-shot circuits, and to output the output signals as the protection factor identification signals.

3. The driving device of the semiconductor device according to claim 1, wherein
the continuation signal generation unit is configured such that when the protection factor occurs and the protection factor generation signal changes a state from a usual state, the continuation signal generation unit changes a state of the protection factor continuation signal from a usual state, when the protection factor generation signal changes the state and recovers to the usual state at an end of the protection factor, the continuation signal generation unit changes the state of the protection factor continuation signal to the usual state.

4. The driving device of the semiconductor device according to claim 1, wherein
the signal selection unit includes a first AND gate and a second AND gate, the protection factor identification signal being input to one input terminal of the first AND gate, the protection factor continuation signal being input to one input terminal of the second AND gate, a signal for selection being input to another input terminal of the first AND gate, an inverted signal of the signal for selection being input to another input terminal of the second AND gate, output signals from the first AND gate and the second AND gate being output to the alarm signal output unit via an OR gate as the selection signals.

5. The driving device of the semiconductor device according to claim 1, wherein
the alarm signal output unit includes a semiconductor switch element with a control terminal configured to receive the selection signal by the signal selection unit, the alarm signal being output from an output terminal coupled to any one of a high-potential side terminal and a low-potential side terminal of the semiconductor switch element.

6. The driving device of the semiconductor device according to claim 5, wherein
the semiconductor switch element includes an N-channel MOSFET, the N-channel MOSFET including a drain, a source coupled to a ground, and a gate coupled to the signal selection unit, the drain being coupled to a DC power supply terminal via any one of a constant current circuit and a pull-up resistor, an output terminal being coupled to a coupling point of the drain with any one of the constant current circuit and the pull-up resistor.

7. The driving device of the semiconductor device according to claim 2, wherein
the continuation signal generation unit is configured such that when the protection factor occurs and the protection factor generation signal changes a state from a usual state, the continuation signal generation unit changes a state of the protection factor continuation signal from a usual state, when the protection factor generation signal changes the state and recovers to the usual state at an end of the protection factor, the continuation signal generation unit changes the state of the protection factor continuation signal to the usual state.

8. The driving device of the semiconductor device according to claim 2, wherein
the signal selection unit includes a first AND gate and a second AND gate, the protection factor identification signal being input to one input terminal of the first AND gate, the protection factor continuation signal being input to one input terminal of the second AND gate, a signal for selection being input to another input terminal of the first AND gate, an inverted signal of the signal for selection being input to another input terminal of the second AND gate, output signals from the first AND gate and the second AND gate being output to the alarm signal output unit via an OR gate as the selection signals.

9. The driving device of the semiconductor device according to claim 3, wherein
the signal selection unit includes a first AND gate and a second AND gate, the protection factor identification signal being input to one input terminal of the first AND gate, the protection factor continuation signal being input to one input terminal of the second AND gate, a signal for selection being input to another input terminal of the first AND gate, an inverted signal of the signal for selection being input to another input terminal of the second AND gate, output signals from the first AND gate and the second AND gate being output to the alarm signal output unit via an OR gate as the selection signals.

10. The driving device of the semiconductor device according to claim 2, wherein
the alarm signal output unit includes a semiconductor switch element with a control terminal configured to receive the selection signal by the signal selection unit, the alarm signal being output from an output terminal coupled to any one of a high-potential side terminal and a low-potential side terminal of the semiconductor switch element.

11. The driving device of the semiconductor device according to claim 3, wherein
the alarm signal output unit includes a semiconductor switch element with a control terminal configured to receive the selection signal by the signal selection unit, the alarm signal being output from an output terminal coupled to any one of a high-potential side terminal and a low-potential side terminal of the semiconductor switch element.

12. The driving device of the semiconductor device according to claim 4, wherein
the alarm signal output unit includes a semiconductor switch element with a control terminal configured to receive the selection signal by the signal selection unit, the alarm signal being output from an output terminal coupled to any one of a high-potential side terminal and a low-potential side terminal of the semiconductor switch element.

* * * * *